United States Patent
Oppermann et al.

(10) Patent No.: US 10,692,675 B2
(45) Date of Patent: Jun. 23, 2020

(54) CONTACTOR HAVING ELECTRONIC COIL CONTROL

(71) Applicants: Christian Oppermann, Amberg (DE); Bernhard Streich, Amberg (DE)

(72) Inventors: Christian Oppermann, Amberg (DE); Bernhard Streich, Amberg (DE)

(73) Assignee: Siemens Aktiengesellschaft, München (DE)

( * ) Notice: Subject to any disclaimer, the term of this patent is extended or adjusted under 35 U.S.C. 154(b) by 441 days.

(21) Appl. No.: 15/720,235

(22) Filed: Sep. 29, 2017

(65) Prior Publication Data
US 2018/0102229 A1 Apr. 12, 2018

(30) Foreign Application Priority Data

Oct. 11, 2016 (EP) .................................... 16193289

(51) Int. Cl.
| H01H 47/00 | (2006.01) |
| H01H 47/32 | (2006.01) |
| H01H 47/04 | (2006.01) |
| H03K 17/28 | (2006.01) |

(52) U.S. Cl.
CPC ........ *H01H 47/325* (2013.01); *H01H 47/002* (2013.01); *H01H 47/04* (2013.01); *H03K 17/28* (2013.01)

(58) Field of Classification Search
None
See application file for complete search history.

(56) References Cited

U.S. PATENT DOCUMENTS

| 5,113,307 | A | 5/1992 | Meyer et al. | |
| 5,910,890 | A * | 6/1999 | Hansen | H01H 47/325 363/41 |
| 2008/0218928 | A1* | 9/2008 | Baek | H01H 47/325 361/143 |
| 2012/0105065 | A1* | 5/2012 | Namou | G01R 31/3275 324/415 |
| 2017/0213677 | A1* | 7/2017 | Yu | H01H 47/02 |

FOREIGN PATENT DOCUMENTS

| CN | 104155908 A | 11/2014 |
| CN | 105914824 A | 8/2016 |
| DE | 29909904 U1 | 9/1999 |
| EP | 0387729 A2 | 9/1990 |
| EP | 1100103 A2 | 5/2001 |

OTHER PUBLICATIONS

Chinese Office Action for Chinese Patent Application No. 201710658454.1, dated Apr. 22, 2019.
European Search Report for European Application No. 16193289. 2-1808, dated Jan. 3, 2017.

* cited by examiner

*Primary Examiner* — Stephen W Jackson
(74) *Attorney, Agent, or Firm* — Lempia Summerfield Katz LLC

(57) ABSTRACT

The disclosure relates to a contactor having electronic coil control for a magnet coil, the operation of keeping the pull-in power of the magnet coil constant being formed by current clocking, and having a safety-related output assembly of a programmable logic controller for the fault diagnosis of the contactor, the safety-related output assembly determining the flow of current flowing into the contactor and detecting a fault if a limit value is undershot and switching off. In the contactor disclosed herein, a connectable base load is integrated in the contactor.

18 Claims, 1 Drawing Sheet

CONTACTOR HAVING ELECTRONIC COIL CONTROL

The application claims the benefit of European Patent Application No. EP 16193289.2, filed Oct. 11, 2016, which is hereby incorporated by reference in its entirety.

TECHNICAL FIELD

The disclosure relates to a contactor having electronic coil control for a magnet coil, wherein the operation of keeping the pull-in power of the magnet coil constant is formed by current clocking, The contactor also has a safety-related output assembly of a programmable logic controller for the fault diagnosis of the contactor, wherein the safety-related output assembly determines the flow of current flowing into the contactor and detects a fault when a limit value is undershot and switches off.

BACKGROUND

A contactor may operate according to the principle of an electromagnet. A current in the excitation coil produces a magnetic flux through a ferromagnetic core and a movably mounted ferromagnetic armature. A force acts on the armature at an air gap, as a result of which the armature switches one or more contacts of the switching element. The armature may be reset to the starting position by spring force as soon as the coil is no longer excited. The opening or closing of the switching element is controlled by exciting the coil. As a result of the coil being excited, a movably mounted contact connected to the armature is connected to a fixed contact of the switching element in an electrically conductive manner or is electrically disconnected from the fixed contact. In the closed state of the switching element, the energy supply for the circuit, which is conducted via the switching element, is maintained. In the open state, the energy supply for the circuit, which is conducted via the switching element, is interrupted.

Contactors are being increasingly controlled by a programmable logic controller (PLC). The outputs of this PLC increasingly include semiconductors having a maximum current load of 0.5 or 2 amperes (A) at 24 volts (V) and a DC current. On account of energy and resource savings, contactors are being increasingly equipped with integrated electronic coil controls. These have a very high brief pull-in power, which is constant in comparison with conventional devices. The energy is saved in the holding period. The pull-in power is kept constant by clocking the current through the magnet coil.

Safety-related output assemblies of programmable logic controllers have various diagnosis possibilities, including short-circuit detection or the possibility of diagnosing the interruptions in the lines to the contactor. For the line interruptions, the output assembly reads back the current flowing into the connected device. If the current is below a limit value, the output assembly detects a fault and switches off. However, because the pull-in power of the contactor is clocked by electronics having a very low power consumption, the situation may arise in which the operation of reading back the current falls either in the start-up phase of the connected device or in a pause in the clock cycle. As a result, a line interruption is detected even though the line is okay.

Conventional DC drives without electronic coil control were previously available in the prior art. Current continuously flows through said drives, with the result that fault messages were excluded.

As an alternative to electronically controlled drives, resistors connected in parallel with the device are also used. The disadvantage of this is that the current continuously flows through these resistors, with the result that heating therefore occurs, on the one hand, and unnecessary power loss occurs, on the other hand.

SUMMARY AND DESCRIPTION

Accordingly, the object of the present disclosure is to provide a contactor having energy-efficient electronic coil control using a safety-related programmable logic controller output.

The scope of the present disclosure is defined solely by the appended claims and is not affected to any degree by the statements within this description. The present embodiments may obviate one or more of the drawbacks or limitations in the related art.

The object is achieved by a contactor having electronic coil control for a magnet coil, the operation of keeping the pull-in power of the magnet coil constant being formed by current clocking, and having a safety-related output assembly of a programmable logic controller for the fault diagnosis of the contactor, the safety-related output assembly determining the flow of current flowing into the contactor and detecting a fault if a basic value is undershot and switching off. In this case, a connectable base load is integrated in the contactor.

A base load is introduced in the contactor in order to avoid false tripping, while retaining the advantages of a low energy consumption. The base load is active only at the time at which it is actually required, e.g., whenever the device is either in the start-up phase and current is not yet flowing through the magnet coil or during the pause times according to the clock specifications of the drive. In order to achieve this, the signal indicating the clock to the drive is inverted and is impressed on a switch in series with the base load. In addition, time control may also be integrated, which time control restricts this active phase to the pull-in process of the contactor.

The advantages of this contactor are that the electronically controlled contactor may be operated without additional outlay on a safety-related programmable logic controller output. The solution also dispenses with the use of an additional resistor, thus resulting in no additional development of heat or power loss.

A continuation of the concept may involve connecting the connectable base load in the start-up phase of the contactor if current is not yet flowing through the magnet coil.

A special configuration of this concept may involve connecting the connectable base load in the pause times of the current clocking for the magnet coil.

One advantageous configuration of the concept may involve connecting a switch in series with the connectable base load.

A continuation of this concept may involve impressing the signal that specifies the clock for the coil control on the switch in an inverted manner.

A special configuration of this concept may involve integrating time control in the contactor.

One advantageous configuration of the concept may involve restricting the active phase of the time control to the pull-in process of the contactor.

The contactor has electronic coil control electrically connected to a magnet coil via a switch. Signal conditioning is arranged between the electronic coil control and the switch, which signal conditioning operates in the manner of an inverter and outputs the signal, which passes to the magnet coil, to an evaluation and control unit again in an inverted manner. The evaluation and control unit may be electrically connected to time control in the form of a timer. The active phase of the time control may be restricted to the pull-in process of the contactor. The evaluation and control unit is also electrically connected to a switch connected in series with a base load. As a result of the switch, the base load may be connected when necessary, e.g., in the start-up phase of the contactor if current is not yet flowing through the magnet coil, or in the pause times of the current clocking for the magnet coil.

BRIEF DESCRIPTION OF THE DRAWINGS

Further embodiments and advantages are explained below based on an exemplary embodiment and the drawing, in which.

DETAILED DESCRIPTION

Figure 1:
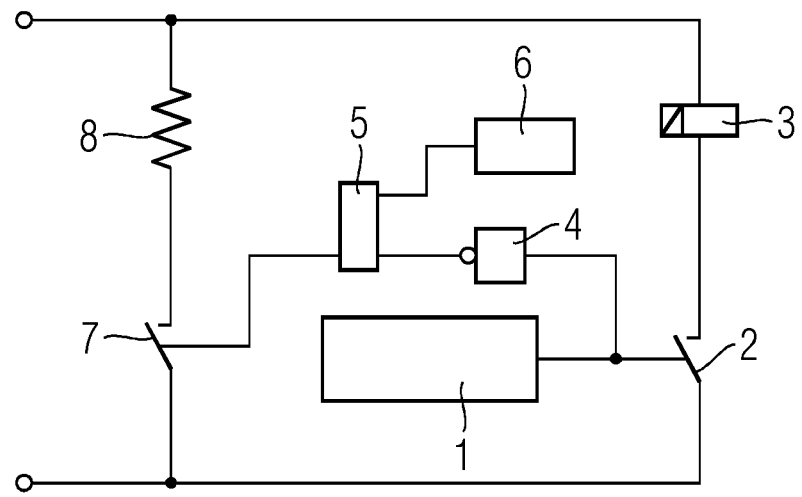
FIG. 1 depicts a schematic illustration of a circuit diagram of a contactor according to an embodiment.

FIG. 1 illustrates a circuit diagram of a contactor. The contactor has electronic coil control 1 electrically connected to a magnet coil 3 via a switch 2. Signal conditioning 4 is arranged between the electronic coil control 1 and the switch 2, which signal conditioning operates in the manner of an inverter and outputs the signal, which passes to the magnet coil 3, to an evaluation and control unit 5 again in an inverted manner. The evaluation and control unit 5 may be electrically connected to time control 6 in the form of a timer. The evaluation and control unit 5 evaluates the two input signals for the time control 6 and the conditioned signal from the magnet coil 3 and passes a corresponding signal to a switch 7 connected in series with a base load 8. As a result of the time control 6, the active phase may be restricted to the pull-in process of the contactor. As a result of the switch 7, the base load 8 may be connected when necessary, e.g., in the start-up phase of the contactor if current is not yet flowing through the magnet coil 3, or in the pause times of the current clocking for the magnet coil 3.

Figure 2:
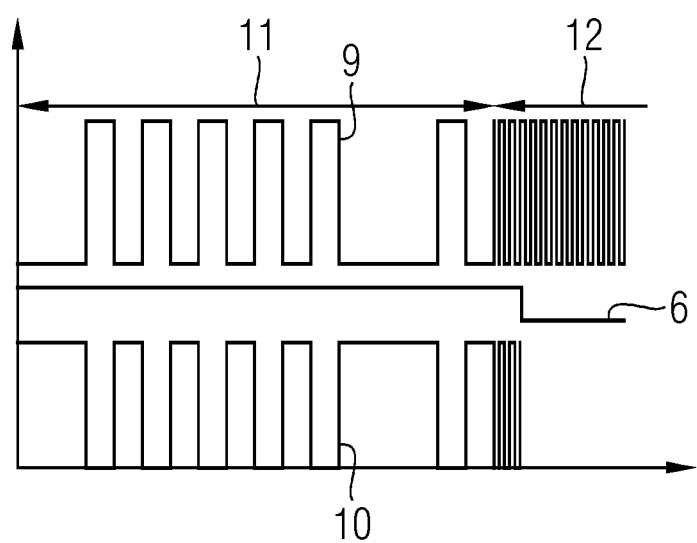
FIG. 2 depicts a graphical illustration of the clocking of the magnet coil and the connectable base load during pull-in operation and holding operation according to an embodiment.

FIG. 2 depicts a graphical illustration for the current clocking 9 in the magnet coil 3 and for the current clocking 10 for the base load 8 during pull-in operation 11 and during holding operation 12. The time control 6 is illustrated between the current clocking 9 for the magnet coil 3 and the current clocking 10 for the base load 8. The active phase of the time control 6 extends only to pull-in operation 11. It may be gathered from the graphical illustration that the base load 8 is active only when it is actually required, e.g., whenever the contactor is either in the start-up phase in which current is not yet flowing through the magnet coil 3 or during the pause times in the current clocking of the magnet coil 3 during pull-in operation 11.

The contactor is distinguished by the fact that it may be operated without additional outlay on the safety-related PLC output. The solution also dispenses with the use of an additional resistor, thus resulting in no additional development of heat or power loss.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A contactor comprising:
   an electronic coil control for a magnet coil, wherein the electronic coil control is configured to keep a pull-in power of the magnet coil constant by current clocking;
   a safety-related output assembly of a programmable logic controller for fault diagnosis of the contactor, wherein the safety-related output assembly is configured to determine a flow of current into the contactor, detect a fault when a limit value is undershot, and switch off; and
   a connectable base load integrated in the contactor.

2. The contactor of claim 1, wherein the connectable base load is connected in a start-up phase of the contactor when current is not flowing through the magnet coil.

3. The contactor of claim 2, wherein the connectable base load is connected in pause times of the current clocking for the magnet coil.

4. The contactor of claim 3, further comprising:
   a switch connected in series with the connectable base load.

5. The contactor of claim 4, wherein a signal specifying a clock for the electronic coil control is impressed on the switch in an inverted manner.

6. The contactor of claim 5, further comprising:
   a time control integrated in the contactor.

7. The contactor of claim 6, wherein an active phase of the time control is restricted to a pull-in process of the contactor.

8. The contactor of claim 1, wherein the connectable base load is connected in pause times of the current clocking for the magnet coil.

9. The contactor of claim 8, further comprising:
   a switch connected in series with the connectable base load.

10. The contactor of claim 9, wherein a signal specifying a clock for the electronic coil control is impressed on the switch in an inverted manner.

11. The contactor of claim 10, further comprising:
    a time control integrated in the contactor.

12. The contactor of claim 11, wherein an active phase of the time control is restricted to a pull-in process of the contactor.

13. The contactor of claim 1, further comprising:
    a switch connected in series with the connectable base load.

14. The contactor of claim 13, wherein a signal specifying a clock for the electronic coil control is impressed on the switch in an inverted manner.

15. The contactor of claim 14, further comprising:
    a time control integrated in the contactor.

16. The contactor of claim 15, wherein an active phase of the time control is restricted to a pull-in process of the contactor.

17. The contactor of claim 1, further comprising:
a time control integrated in the contactor.

18. The contactor of claim 17, wherein an active phase of the time control is restricted to a pull-in process of the contactor.

\* \* \* \* \*